(12) United States Patent
Pappu et al.

(10) Patent No.: US 10,249,597 B2
(45) Date of Patent: Apr. 2, 2019

(54) SYSTEMS, METHODS, AND APPARATUSES FOR IMPLEMENTING DIE RECOVERY IN TWO-LEVEL MEMORY (2LM) STACKED DIE SUBSYSTEMS

(71) Applicant: Intel Corporation, Santa Clara, CA (US)

(72) Inventors: Lakshminarayana Pappu, Folsom, CA (US); Kalyan C. Kolluru, Portland, OR (US); Pete D. Vogt, Boulder, CO (US); Christopher J. Nelson, Gilbert, AZ (US); Amande B. Trang, Phoenix, AZ (US); Uddalak Bhattacharya, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 15/283,055

(22) Filed: Sep. 30, 2016

(65) Prior Publication Data
US 2018/0096971 A1  Apr. 5, 2018

(51) Int. Cl.
| G11C 5/06 | (2006.01) |
| H01L 25/065 | (2006.01) |
| H01L 25/18 | (2006.01) |
| G11C 5/02 | (2006.01) |
| G11C 29/02 | (2006.01) |
| G11C 29/12 | (2006.01) |
| G11C 29/48 | (2006.01) |
| G11C 29/00 | (2006.01) |

(52) U.S. Cl.
CPC .......... *H01L 25/0657* (2013.01); *G11C 5/025* (2013.01); *G11C 29/025* (2013.01); *G11C 29/1201* (2013.01); *G11C 29/48* (2013.01); *G11C 29/702* (2013.01); *H01L 25/18* (2013.01); *H01L 2225/06527* (2013.01); *H01L 2225/06544* (2013.01); *H01L 2225/06555* (2013.01)

(58) Field of Classification Search
CPC ................. H01L 25/0657; H01L 25/18; H01L 2225/06555; H01L 2225/06527; H01L 2225/06544; G11C 11/4096
USPC .......................................................... 365/63
See application file for complete search history.

(56) References Cited

U.S. PATENT DOCUMENTS

| 9,208,836 B1* | 12/2015 | Ware ..................... G11C 7/1051 |
| 2013/0294184 A1* | 11/2013 | Yang ................... H01L 25/0657 365/200 |
| 2015/0348222 A1* | 12/2015 | Surti ........................ G06T 1/20 345/426 |

* cited by examiner

*Primary Examiner* — Tha-O H Bui
(74) *Attorney, Agent, or Firm* — Schwabe, Williamson & Wyatt, P.C.

(57) ABSTRACT

Systems, methods, and apparatuses for implementing die recovery in Two-Level Memory (2LM) stacked die subsystems are described. A stacked semiconductor package includes a processor functional silicon die at a first layer of the stacked semiconductor package; one or more memory dies forming a corresponding one or more memory layers of the stacked semiconductor package; a plurality of Through Silicon Vias (TSV s) formed through the one or more memory dies; a plurality of physical memory interfaces electrically interfacing the one or more memory dies to the processor functional silicon die at the first layer through the memory layers via the plurality of TSVs; and a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

28 Claims, 12 Drawing Sheets

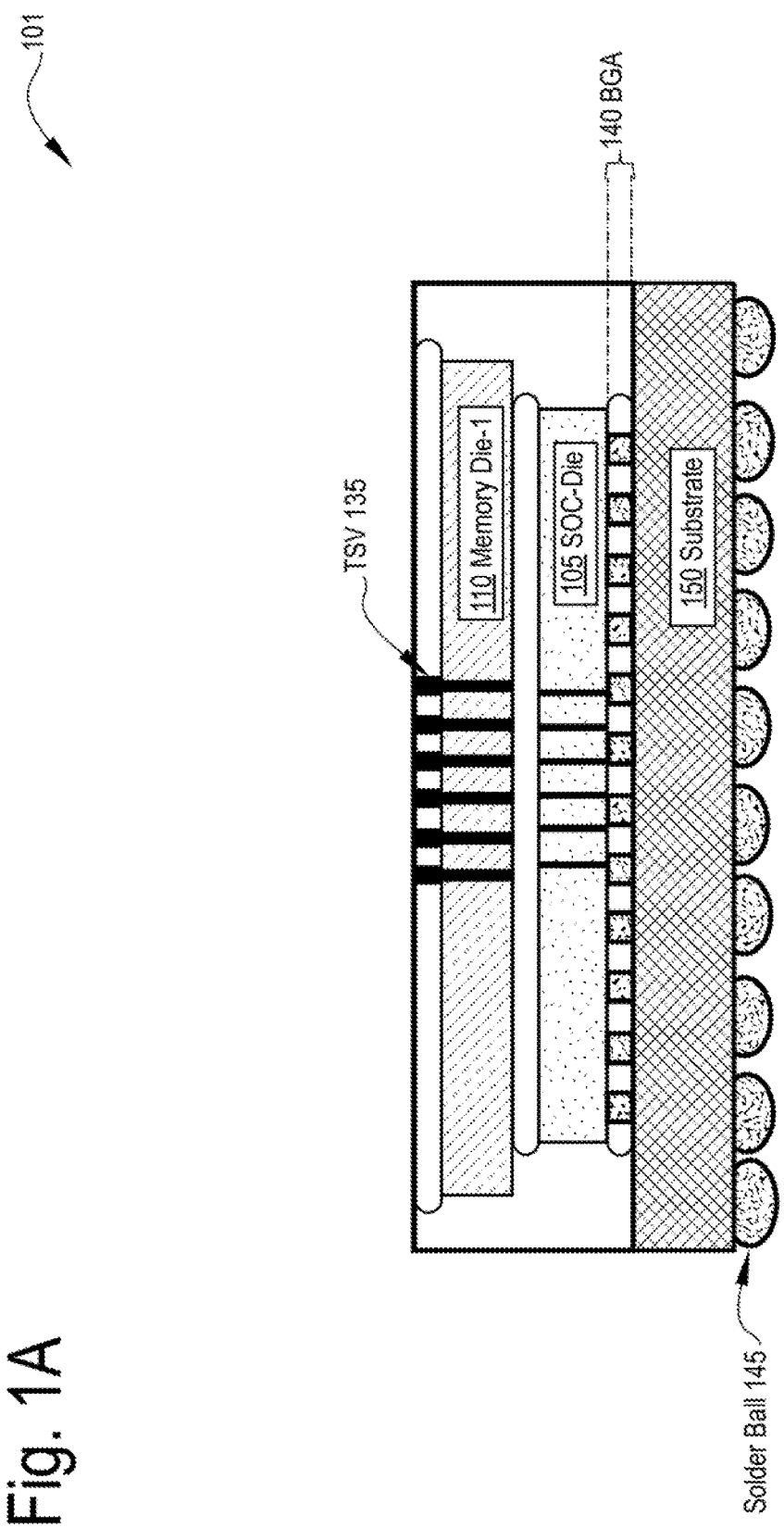

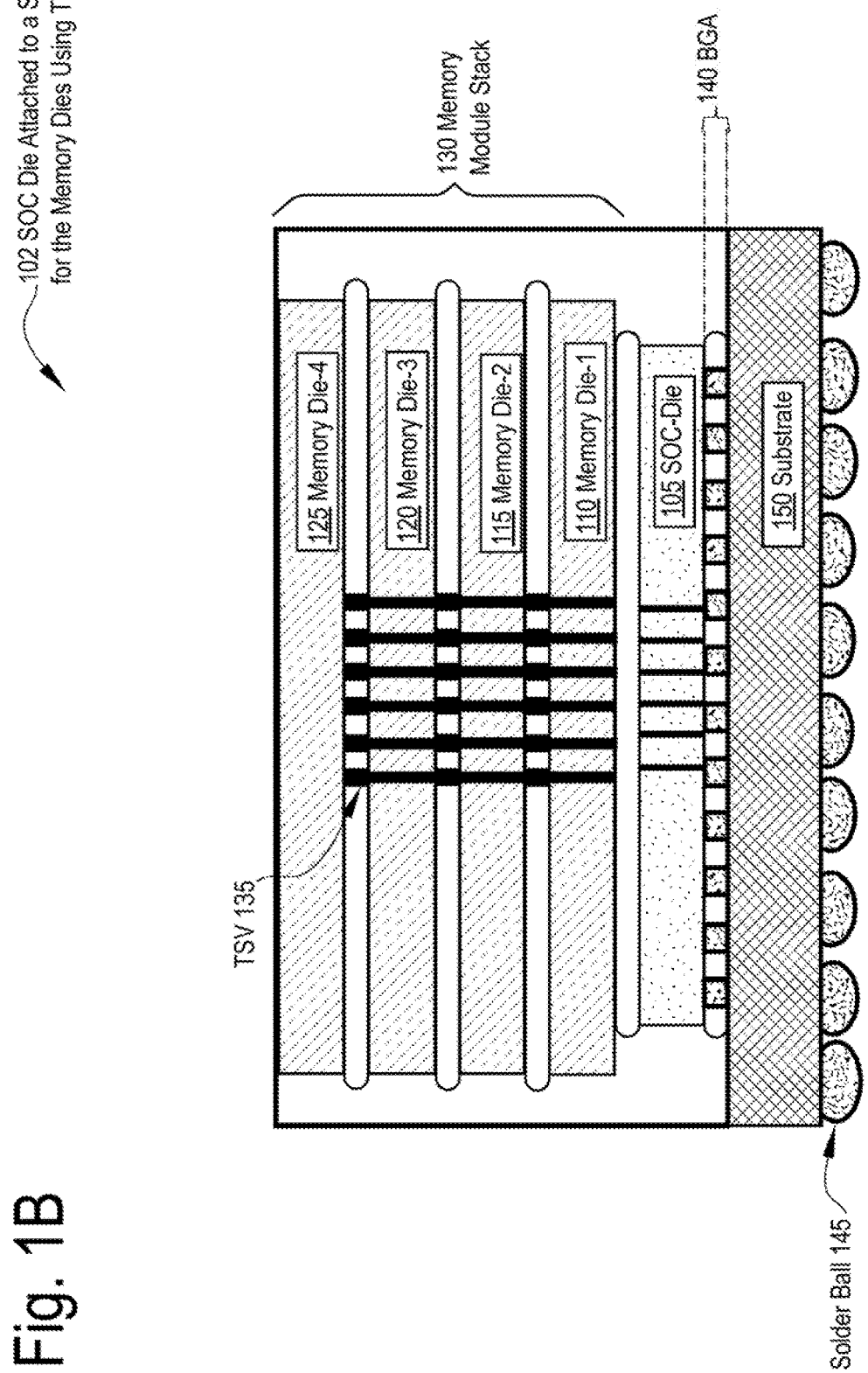

Fig. 6

| 699 Detour Encoding | 600 Mux Selects (in Order of Signals Starting with CA9) | 615 DA8 | 620 CA9 | 625 CA10 | 630 CA8 | 635 CA7 | 640 CA6 | 645 CA3 | 650 CA4 | 655 CA5 | 660 CA2 | 665 CA1 | 670 CA0 |
|---|---|---|---|---|---|---|---|---|---|---|---|---|---|
| 0h | 616 Mux Select: Signal on Lane | NC | 0 CA9 | 0 CA10 | 0 CA8 | 0 CA7 | 0 CA6 | 0 CA3 | 0 CA4 | 0 CA5 | 0 CA2 | 0 CA1 | 0 CA0 |
| 1h | 602 Mux Select: Signal on Lane | CA9 | 1 NC | 0 CA10 | 0 CA8 | 0 CA7 | 0 CA6 | 0 CA3 | 0 CA4 | 0 CA5 | 0 CA2 | 0 CA1 | 0 CA0 |
| 2h | 614 Mux Select: Signal on Lane | CA9 | 1 CA10 | 1 NC | 0 CA8 | 0 CA7 | 0 CA6 | 0 CA3 | 0 CA4 | 0 CA5 | 0 CA2 | 0 CA1 | 0 CA0 |
| 3h | 603 Mux Select: Signal on Lane | CA9 | 1 CA10 | 1 CA8 | 1 NC | 0 CA7 | 0 CA6 | 0 CA3 | 0 CA4 | 0 CA5 | 0 CA2 | 0 CA1 | 0 CA0 |
| 4h | 604 Mux Select: Signal on Lane | CA9 | 1 CA10 | 1 CA8 | 1 CA7 | 1 NC | 0 CA6 | 0 CA3 | 0 CA4 | 0 CA5 | 0 CA2 | 0 CA1 | 0 CA0 |
| 5h | 605 Mux Select: Signal on Lane | CA9 | 1 CA10 | 1 CA8 | 1 CA7 | 1 CA6 | 1 NC | 0 CA3 | 0 CA4 | 0 CA5 | 0 CA2 | 0 CA1 | 0 CA0 |
| 6h | 606 Mux Select: Signal on Lane | CA9 | 1 CA10 | 1 CA8 | 1 CA7 | 1 CA6 | 1 CA3 | 1 NC | 0 CA4 | 0 CA5 | 0 CA2 | 0 CA1 | 0 CA0 |
| 7h | 607 Mux Select: Signal on Lane | CA9 | 1 CA10 | 1 CA8 | 1 CA7 | 1 CA6 | 1 CA3 | 1 CA4 | 1 NC | 0 CA5 | 0 CA2 | 0 CA1 | 0 CA0 |
| 8h | 608 Mux Select: Signal on Lane | CA9 | 1 CA10 | 1 CA8 | 1 CA7 | 1 CA6 | 1 CA3 | 1 CA4 | 1 CA5 | 1 NC | 0 CA2 | 0 CA1 | 0 CA0 |
| 9h | 609 Mux Select: Signal on Lane | CA9 | 1 CA10 | 1 CA8 | 1 CA7 | 1 CA6 | 1 CA3 | 1 CA4 | 1 CA5 | 1 CA2 | 1 NC | 0 CA1 | 0 CA0 |
| Ah | 610 Mux Select: Signal on Lane | CA9 | 1 CA10 | 1 CA8 | 1 CA7 | 1 CA6 | 1 CA3 | 1 CA4 | 1 CA5 | 1 CA2 | 1 CA1 | 1 NC | 0 CA0 |
| Bh | 611 Mux Select: Signal on Lane | CA9 | 1 CA10 | 1 CA8 | 1 CA7 | 1 CA6 | 1 CA3 | 1 CA4 | 1 CA5 | 1 CA2 | 1 CA1 | 1 CA0 | 1 NC |
| Ch - Fh | 612 Mux Select: Signal on Lane | NC | 0 CA9 | 0 CA10 | 0 CA8 | 0 CA7 | 0 CA6 | 0 CA3 | 0 CA4 | 0 CA5 | 0 CA2 | 0 CA1 | 0 CA0 |

SYSTEMS, METHODS, AND APPARATUSES FOR IMPLEMENTING DIE RECOVERY IN TWO-LEVEL MEMORY (2LM) STACKED DIE SUBSYSTEMS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The subject matter described herein relates generally to the field of semiconductor and electronics manufacturing, and more particularly, to systems, methods, and apparatuses for systems, methods, and apparatuses for implementing die recovery in Two-Level Memory (2LM) stacked die subsystems.

BACKGROUND

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also correspond to embodiments of the claimed subject matter.

The modern consumer electronics market frequently demands complex functions requiring very intricate circuitry. Scaling to smaller and smaller fundamental building blocks, (e.g. transistors), has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support increased circuit density.

One solution to such a problem is to stack the functional silicon devices into 3D (three dimensional) semiconductor packages formed from multiple functional silicon dies including one or more memories and one or more logic dies.

The more densely packed the functional elements become within any given semiconductor package, the better the performance will be for that semiconductor package as there can be more "stuff" within the same physical space capable of performing functional aspects of the functional semiconductor silicon dies and devices of the semiconductor package and the shorter the information must travel, thus resulting in faster processing.

Reducing the total space occupied by the same number of functional silicon dies helps to address this problem by stacking the functional silicon dies into a package to realize such physical space reductions.

But such a solution introduces additional complexity and brings additional problems which must now be addressed.

The present state of the art may therefore benefit from the means for implementing die recovery in Two-Level Memory (2LM) stacked die subsystems as described herein.

BRIEF DESCRIPTION OF THE DRAWINGS

Embodiments are illustrated by way of example, and not by way of limitation, and will be more fully understood with reference to the following detailed description when considered in connection with the figures in which:

FIG. 1A depicts an exemplary stacked semiconductor device in accordance with which embodiments may operate;

FIG. 1B depicts an exemplary stacked semiconductor device in accordance with which embodiments may operate;

FIG. 6 depicts a table which may be used for shifting the address signals for any possible failed lane in accordance with described embodiments;

DETAILED DESCRIPTION

Figure 2:
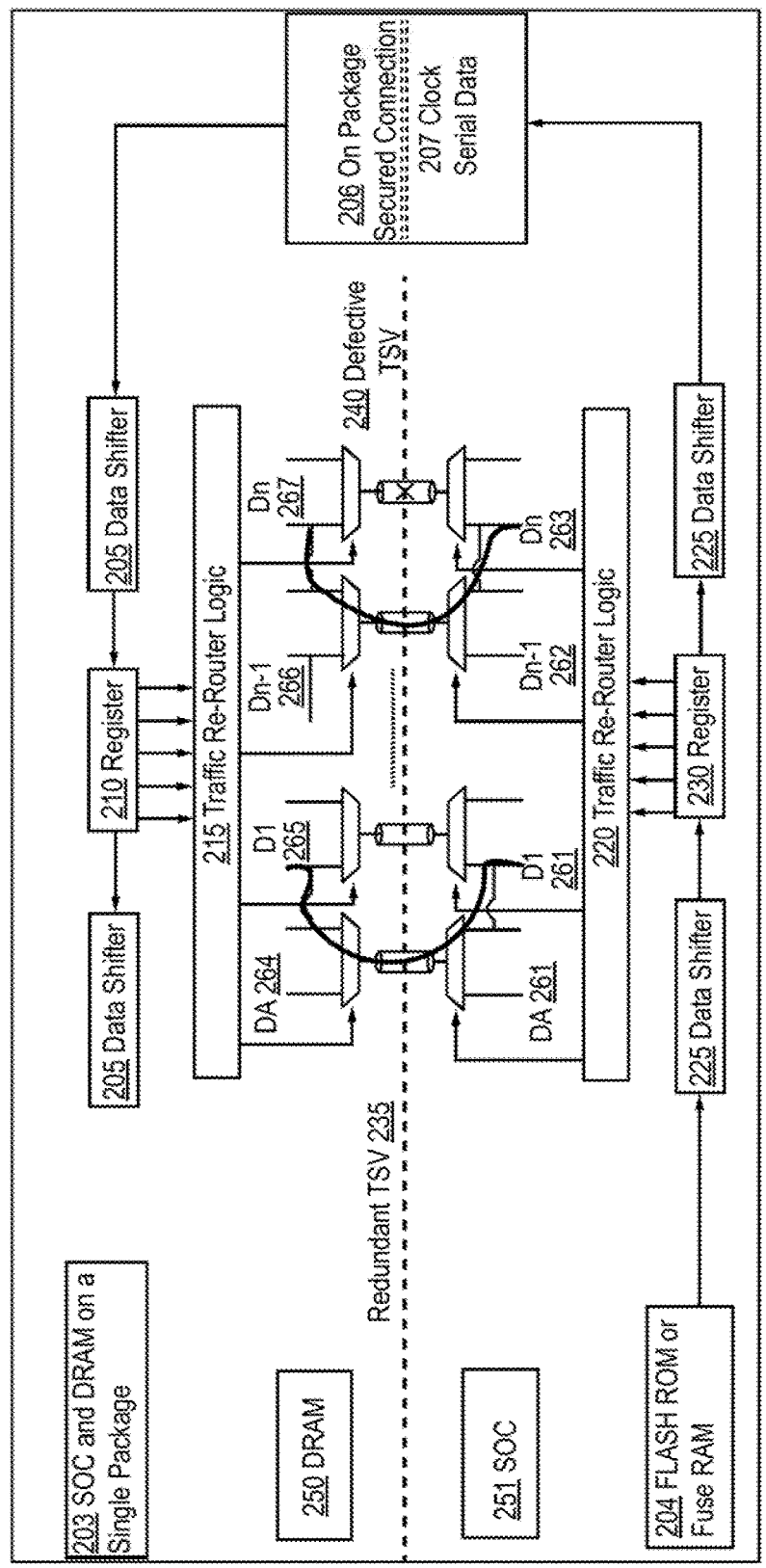
FIG. 2 depicts an exemplary stacked semiconductor device having a faulty or defective TSV identified therein along with a recovery procedure.

Described herein are systems, methods, and apparatuses for implementing die recovery in Two-Level Memory (2LM) stacked die subsystems. For instance, there is disclosed in accordance with one embodiment a stacked semiconductor package having therein: a processor functional silicon die at a first layer of the stacked semiconductor package; one or more memory dies forming a corresponding one or more memory layers of the stacked semiconductor package; a plurality of Through Silicon Vias (TSVs) formed through the one or more memory dies, wherein each of the plurality of TSVs traverse through the one or more memory layers to the processor functional silicon die at the first layer of the stacked semiconductor package; a plurality of physical memory interfaces electrically interfacing the one or more memory dies to the processor functional silicon die at the first layer through the memory layers via the plurality of TSVs; a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

In the following description, numerous specific details are set forth such as examples of specific systems, languages, components, etc., in order to provide a thorough understanding of the various embodiments. It will be apparent, however, to one skilled in the art that these specific details need not be employed to practice the embodiments disclosed herein. In other instances, well known materials or methods have not been described in detail in order to avoid unnecessarily obscuring the disclosed embodiments.

In addition to various hardware components depicted in the figures and described herein, embodiments further include various operations which are described below. The operations described in accordance with such embodiments may be performed by hardware components or may be embodied in machine-executable instructions, which may be used to cause a general-purpose or special-purpose processor programmed with the instructions to perform the operations. Alternatively, the operations may be performed by a combination of hardware and software.

Any of the disclosed embodiments may be used alone or together with one another in any combination. Although various embodiments may have been partially motivated by deficiencies with conventional techniques and approaches, some of which are described or alluded to within the specification, the embodiments need not necessarily address or solve any of these deficiencies, but rather, may address only some of the deficiencies, address none of the deficiencies, or be directed toward different deficiencies and problems which are not directly discussed.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1A depicts an exemplary stacked semiconductor device 101 in accordance with which embodiments may operate.

In particular, the depicted semiconductor device 101 embodies a Two-Level Memory (2LM) stacked die subsystem having both a System On a Chip (SOC) die 105 at a bottom layer also called "logic die" or a functional silicon die or a functional semiconductor device and then a memory die (e.g., memory die-1) 110 at a top layer. There is further depicted a substrate 150 which is interfaced with the SOC-die 105 and the memory die 110 via the Ball Grid Array (BGA) 140 as shown. Electrical interconnects of the top memory die 110 are electrically interfaced to the substrate 150 first through the Through Silicon Vias (TSVs) 135 as shown and then through the BGA and into the substrate 150.

Additionally depicted are the solder balls 145 to provide electrical connectivity between the substrate and another board, such as a main board, a Printed Circuit Board (PCB) motherboard, etc.

The stacked semiconductor device 101 depicted here provides one or more three dimensional (3D) stacked memory modules (e.g., memory die-1 at element 110) which are tightly integrated into the microprocessors, such as SOC-die 105.

Such technology meets the low power consumption and high bandwidth requirements now demanded by the computing industry and consumer electronics marketplace.

Consequently, it is of critical importance that such memory dies (e.g., memory die-1) operate reliably as the integrated components cannot be swapped out after manufacture. State differently, failure of a single integrated component necessitates replacement of the entire stacked semiconductor device 101 at great expense.

According to one embodiment, a first memory layer is formed from a DRAM semiconductor die. According to a particular embodiment, the DRAM is glued or affixed to the SOC die or another logic die. According to another a second level memory die is formed from a phase change memory. Phase-change memory or SXP memory (also known as PCM, PCME, PRAM, PCRAM, Ovonic Unified Memory, Chalcogenide RAM and C-RAM) is a type of non-volatile random-access memory. By keeping the memory physically closer to the CPU die, logic die, or SOC die as is depicted here, critical applications are able to run faster.

According to certain embodiments, the memory dies form near memory for the SOC die which may be utilized as caching memory due to its close proximity with the SOC die.

FIG. 1B depicts an exemplary stacked semiconductor device 102 in accordance with which embodiments may operate.

In particular, there is depicted a System On a Chip (SOC) attached to a stack for the memory dies using TSVs 135 in which the TSVs provide connectivity from the uppermost memory die-4 at element 125 down through openings formed through each of the memory dies 3, 2, and 1, at elements 120, 115, and 110 respectively, and ultimately through the SOC-die 105 to the BGA 140 layer and into the substrate 150 which as before may be connected with another main board or PCB motherboard, etc., using the solder balls 145.

As shown, a memory module stack 130 is formed from the memory dies 1, 2, 3, and 4 (elements 110, 115, 120, and 125) providing memory to the SOC-die 105 within a single 3D stacked semiconductor package 102.

As depicted here, the stacked memory dies 1, 2, 3, and 4 (elements 110, 115, 120, and 125) are connected to one to another and also to the CPU embodied within the SOC-die 105 through the TSV 135 interconnects. The TSVs are leveraged in such a design to enable the vertical stacking of such memory chips. The 3D stacked semiconductor approach is especially beneficial at wafer level packaging permitting "vias" to be opened (e.g., a trench or opening etched into the material) from the front side of the wafer all the way through the wafer and then out the back of the wafer, forming, in essence, a hole through the functional semiconductor device. The vias or TSVs formed through the functional silicon devices may vary in diameter from 1 µm (micron) to 10 µm with a depth typically being 5 to 10 times the width.

The TSVs 135 provide a critical communications interface from the upper level functional dies, be they memory dies, SOC dies, logic dies, or otherwise, to the substrate below. Any stress to the TSVs 135 resulting from the assembly process, random defects or anomalies, or even systematic defects in the manufacturing process which forms the TSVs 135 at the per-functional silicon die level or at the assembled stacked semiconductor device 102 level has the potential to render the entire manufactured stacked semiconductor device 102 useless. It is also feasible that the TSV operates when formed and even when the dies are integrated into the stacked semiconductor device 102 but then fail shortly after, for instance, due to high electrical stress, due to temperature changes, and so forth. Through testing it is possible to cause such early life failures of the devices to occur during manufacturing and testing processes during which time the faulty TSVs may also therefore be re-worked, thus preventing scrap loss and also preventing such failure modes from reaching consumers.

Conventionally, defective stacked semiconductor device 102 necessitated scrapping the entire stacked semiconductor device 102 as it could not be re-worked and having even a single TSV 135 amongst the many utilized resulted in reduced functionality or non-functionality for the entire stacked semiconductor device 102.

More problematically, certain stacked semiconductor device 102 embody not just functional silicon devices such as SOC-dies 105 or logic dies manufactured by the producer of the stacked semiconductor device 102 but additionally embody memory dies (110, 115, 120, 125) purchased from external third party companies, meaning that purchase product which was to be integrated into a finished product was also scrapped, resulting in a substantial financial loss to the manufacturer of the stacked semiconductor device 102.

Moreover, manufacturing of the TSVs 135 is an inherently complex process and depending on the precise methodologies, the process of forming the TSVs 135 results in anywhere from a 10-12% yield loss which translates in turn to upwards of 200 million dollars in financial losses attributable to the manufacturer of such products due to TSV 135 defects and scrap at the per-device and stacked semiconductor device 102 level, with the scrap of any finished stacked semiconductor device 102 being much more costly.

It is therefore in accordance with described embodiments that a TSV 135 repair process is utilized to permit the recovery of such stacked semiconductor devices 102 even in the presence of a faulty or defective TSV 135 embedded within the stacked semiconductor device 102. Statistical analysis reveals that such a repair process is should recover approximately 99.95% of previously unworkable and therefore scrapped product, thus providing a cost savings which far outweighs the additional cost necessary to implement the described methodologies.

FIG. 2 depicts an exemplary stacked semiconductor device 201 having a faulty or defective TSV 240 identified therein along with a recovery procedure.

In particular, there is depicted an SOC and DRAM embodied within a single package 203, thus forming the stacked semiconductor device 201. The top layer is formed by the DRAM 250 which is stacked upon the bottom SOC 251 layer. Multiple TSVs provide interconnectivity from the DRAM 250 on top through the SOC 251 below.

Within the DRAM 250 it may be observed multiple TSVs including the defective TSV 240 on the far right, a redundant TSV 235 on the far left. From left to right, there are TSV connections DA 264 to DA 261 (which forms the redundant TSV 235), then D1 265 to D1 261, then Dn-1 266 to Dn-1 262 and finally Dn 267 to Dn 263 (which is the identified defective TSV 240).

Although four such TSVs are depicted here for the purposes of illustration, there may be and very likely will be many more TSVs for any given stacked semiconductor device 201.

Additionally depicted are the top traffic re-router logic 215 of the DRAM 250 and the bottom traffic re-router logic 220 of the SOC 251. An on package secured connection 206 and clock serial data 207 are additionally provided.

The FLASH ROM or fuse RAM 204 is shown flowing to data shifter 225, to register 230, to data shifter 225, to the clock serial data 207 to the on package secured connection 206 and then around to the upper layer's data shifters 205 and registers 210. The registers 210 of the top layer and the registers 230 of the bottom layer are communicably interfaced with the traffic re-router logics 215 and 220 respectively.

It is therefore in accordance with described embodiments that a variety of algorithms and low cost hardware DFX infrastructure (DFX is "Design for X" or "Design For Excellence" in the context of manufacturing).

According to a particular embodiment, having identified a defective TSV 240 a "traffic detour string" is calculated to determine detour routes which permit the traffic from the upper layer DRAM 250 to be re-routed or detoured through one or more redundant TSVs 235.

For instance, on every cold-boot of the stacked semiconductor device the traffic detour string is downloaded from a fuse bank or the registers 230 on the SOC 251 side where a CPU resides. According to such an embodiment, a secure link is then established from the SOC 251 layer to the DRAM 250 layer through the data shifters 225 and 205 as depicted the on package secured connection 206.

For instance, utilizing a built-in safe network from a CPU of the SOC 251 the stacked DRAM 250 module the traffic-detour string is then shifted into the DRAM 250 module. Once the traffic-detour string is received at the DRAM 250 the data shifters 205 of the DRAM 250 may then program the registers 210 of the DRAM to enable the data shift or the data detour based on the received and previously computed traffic detour string.

According to a particular embodiment, the introduction and inclusion of as few as 192 storage bits via the registers 210 and 230 it is then possible to recover the yields from previously scrapped stacked semiconductor devices 201 having faulty or defective TSVs 240 by up to 99.95%.

According to particular embodiments, third party DRAM vendors (e.g., providing DRAM 250 module embedded with a stacked semiconductor device 201 by the manufacturer of the CPU and SOC 251) incorporate the register 210 storage bits via their own manufacturing processes, thus embodying the needed registers 210 and data shifter 205 logic within their devices at very little cost and effort pursuant to provided technical specifications as provided by the manufacturer of the CPU, SOC 251, and resulting stacked semiconductor device 201.

Additionally, utilizing a 2-wire interconnect within the stacked semiconductor device 201 the on package secured connection 206 is embodied within the stacked semiconductor device 201 capable to transfer the TSV detour string from the SOC 251 die fabricated and manufactured by a first manufacturer to the DRAM 250 or other memory device, even when manufactured by another third party manufacturer.

According to such embodiment, a 2-wire interface is provided within the stacked semiconductor device 201 thus permitting on package secure connections from the SOC 251 to the DRAM 250. According to such an embodiment, a mirrored image of the TSV detour string from the SOC 251 is transmitted to the third party manufacturer supplied DRAM 250 silicon module that is integrated the final stacked semiconductor device 201 end product.

No prior solutions for TSV repair are available to the marketplace presently.

Because the dedicated two wires are embedded within the stacked semiconductor device 201 to transfer the data from SOC 251 die to the DRAM 250 die, any signals transmitted thereupon simply cannot be intercepted by any hackers as there is no externally facing interface. Thus, it is not possible for hackers to derive any data flow transferred into the DRAM or even derive whether the signal traverses its intended TSV or a redundant TSV. Moreover, the re-routing capability is configurable on a per-unit basis for each stacked semiconductor device 201 manufactured, thus permitted extensive flexibility within a High Volume Manufacturing (HVM) environment. Such flexibility is needed as defects and faults may arise as random anomalies thus necessitating different routing schemes for any particular device. Because every stacked semiconductor device 201 unit manufactured may be programmed differently, it is possible to fully recover any device having a single TSV failure where just one redundant TSV is provided. Additionally, due to the very low memory requirements (e.g., as few as 192 bits of register storage) the solution also represents a very low cost to third party DRAM 250 vendors which provide additional dies to the manufacturer of the CPU and SOC 251 die who also integrates and manufactures the stacked semiconductor device 201.

According to a particular embodiment, implementing the TSV signal re-routing includes first identifying any defective micro pillars associated with the TSVs in any stacked semiconductor device 201 manufactured, then computing a detour string through an algorithm that re-routes DRAM address and data signals as described in additional detail below, and then storing the computed detour strings securely within a fuse bank which is not externally accessible. During a cold or warm boot, the stacked semiconductor device 201 then downloads its re-routing string and shifts the string from the SOC 251 die to one or more upper memory DRAM 250 dies which each then securely store the re-routing string within their fuse banks so as to implement the needed TSV path re-routing during operation.

Figure 3:
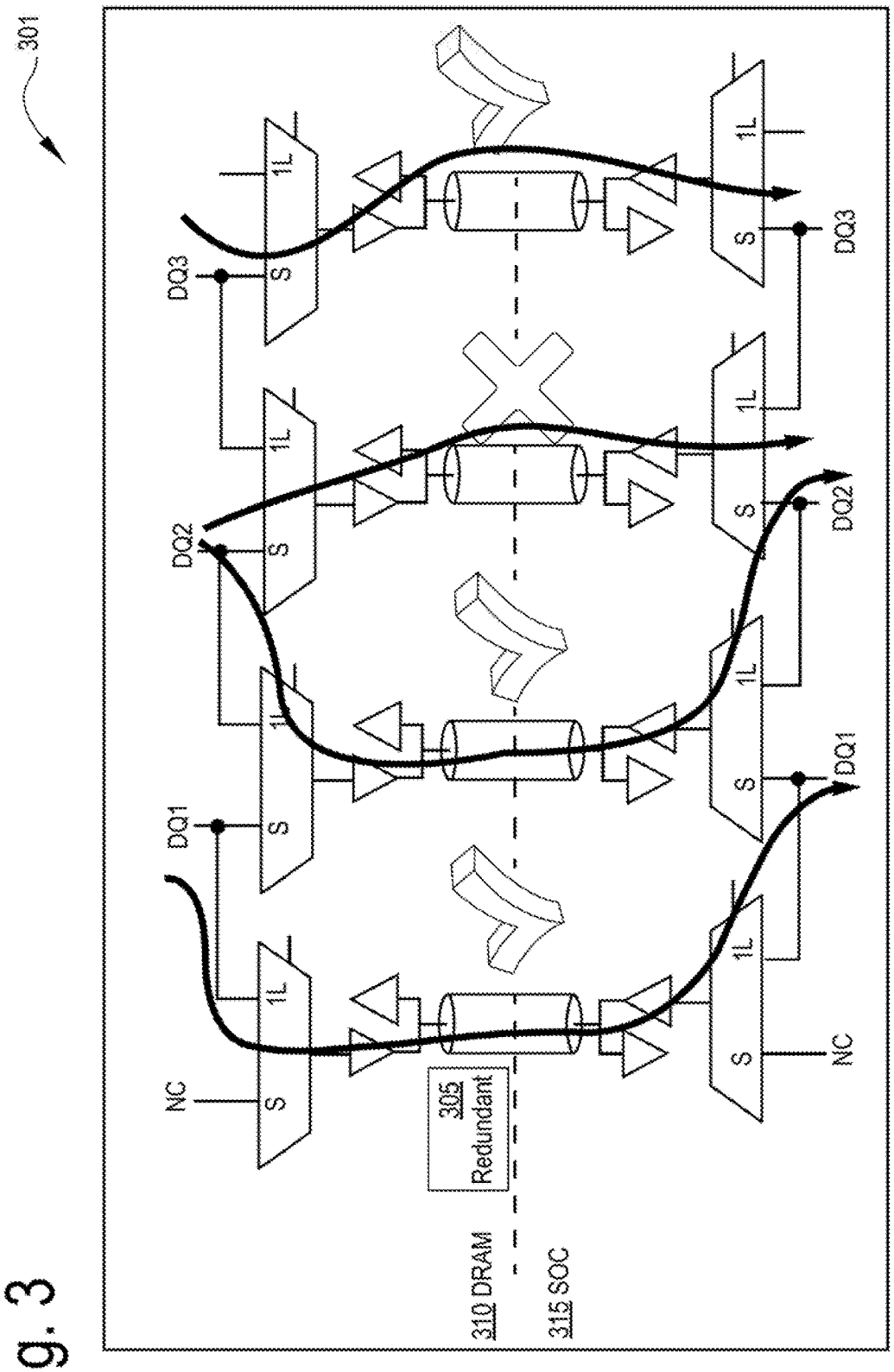
FIG. 3 depicts another exemplary stacked semiconductor device having a faulty or defective TSV identified therein along with a recovery procedure.

FIG. 3 depicts another exemplary stacked semiconductor device 301 having a faulty or defective TSV 240 identified therein along with a recovery procedure.

As depicted here, TSV pillar DQ2 is defective and a corresponding re-routing of the traffic is therefore shown with the traffic re-routing constituting a shift by 1 in this specific example. In this scheme the signal intended for TSV pillar DQ2 is routed through the DQ1 TSV pillar and the signals destined for TSV pillar DQ1 are re-routed to proceed through redundant pillar. Accordingly, in a non-defective mode, the re-routing string for this particular example would be "0000" as there would be no need to re-route when non-defective, however, because TSV pillar DQ2 is identified as defective, the re-routing string "1100" is utilized to cause the mux (multiplexer) to select the appropriate routes to detour traffic from the DRAM 310 side and the CPU or SOC 315 side.

In greater specificity, there is shown a stacked semiconductor device 301 having, by way of example, the four TSV pillars, three of which are needed for routing signals, and one of which is a redundant 305 TSV pillar through which signals or traffic between the two dies formed from the DRAM 310 and SOC 315 may be re-routed or detoured if necessary, such as in the event of an identified defective TSV pillar within the stacked semiconductor device 301.

As depicted here, the stacked semiconductor device 301 includes both a DRAM 310 module formed from the upper functional silicon die (here a memory die) and also a SOC 315 formed from the lower functional silicon die (here a CPU or logic die).

From the left to right, the left most TSV pillar forms a redundant 305 TSV pillar meaning that if all of the TSV pillars are fully functional, the left most redundant 305 will not be needed and will therefore be embedded within the stacked semiconductor device 301 but simply will not be used. However, there is depicted here a functional redundant 305 TSV pillar at the far left (TSV pillar NC), with another functional TSV pillar at the second from the left (TSV pillar DQ1), and then a faulty TSV pillar third from the left (TSV pillar DQ2), and finally another functional TSV pillar on the far right (TSV pillar DQ3).

Notably, each TSV pillar is connected with a mux and de-mux (decoder or demultiplexer), permitting both S and 1L signal routes at each potential TSV path, though only one is used for any TSV pillar, whether functional or not. Rather than a straight fixed path, embodiments as described herein permit any signal destined to traverse a specified TSV pillar to either traverse the intended TSV pillar or to be re-routed or detoured through another TSV pillar. In such a way, where a defective TSV pillar is identified as is the case with TSV pillar DQ2, the signal may be re-routed or detoured through the neighboring TSV pillar.

As shown here, the rightmost signal traverses its specified and intended TSV pillar, going from DQ3 through signal path S down through TSV pillar DQ3 and received at signal path S. This is normal and intended behavior.

However, TSV pillar DQ2 is identified as a defective TSV pillar, and the signal path simply cannot be routed through the TSV pillar. Any signal routed from DQ2 at the DRAM 310 side through signal path S to signal path S of DQ2 at the SOC 315 side will fail.

Consequently, the signal path is re-routed instead to the neighboring TSV pillar, thus causing the signal intended for DQ2 to travel through DQ1 instead. Therefore, the signal to travel through DQ2 is re-routed or detoured to travel instead through signal path 1L of DQ1, the neighboring TSV pillar at the DRAM 310 side and through TSV pillar DQ1 to signal path 1L of TSV pillar DQ1 at the SOC 315 side.

However, TSV pillar DQ1 can only carry a single signal and therefore, because its signal path has been consumed by its neighbor, it cannot carry its own intended signal. Therefore, the data shifter as programmed via the registers (refer to FIG. 2) re-routes the signal destined for DQ1 to its neighbor, thus causing the signal intended for DQ1 to re-route through signal path 1L of TSV pillar NC at DRAM 310 through TSV pillar NC (e.g., the redundant TSV pillar) down to signal path 1L at TSV pillar NC (e.g., the redundant TSV pillar) at the SOC 315 side.

Because any signal may be sent down either one of the two available paths using the provided muxes (multiplexers) it is therefore possible to logically re-route the path taken by any signal through the available TSVs, including detouring or re-routing the signals as necessary to avoid a defective TSV and instead route through a functional neighboring TSV. By then shifting each signal path to its neighbor the faulty TSV may be avoided completely. The continuous shifting will eventually reach an edge or a last available TSV which is then routed to a neighboring redundant TSV whose function is not needed when all TSVs are functional but whose functionality may be leveraged for a repair and re-routing procedure where a faulty TSV is identified.

The calculated routing string calculated is burnt into a fuse bank so that it may be subsequently read out on any cold or warm boot procedure, after which that routing string is then propagated through the layers (e.g., the multiple semiconductor dies of the stack) such that every layer is instructed how to route signals through the available TSVs, whether through a default route (e.g., a 0 in the string) or a non-default route (e.g., a 1 in the string).

Having determined the value of the routing string to fix any particular semiconductor stack and having propagated the string, the data shifters then route the signals as appropriately by muxing any given signal to either a default or non-default path, as necessary, so as to permit the signal to traverse through the TSV pillars to its intended destination, notwithstanding the presence of a faulty TSV pillar.

According to described embodiments, determining whether a faulty TSV is present in the stacked semiconductor device, calculating the re-routing string, and burning the re-routing string permanently into the fuse bank occurs only once at the time of manufacture of that stacked semiconductor device. Conversely, downloading the re-routing string, propagating it to the other layers of the stacked semiconductor device and performing the data/signal shifting via the available muxes at each TSV pillar occurs at every cold boot and potentially at every warm boot.

According to one embodiment, the fuse bank comprises a plurality of fuses which are burnt in on the CPU or SOC die side at the time of manufacture of the stacked semiconductor device and cannot be modified subsequently. Consequently, the stacked semiconductor device will operate in accordance with the determined re-routing procedure and the calculated re-routing string permanently from then forward since the burnt fuses cannot be modified.

Therefore, according to a particular embodiment, processing at the time of manufacture includes first, determining that a faulty TSV is present within the stacked semiconductor package and then computing the necessary re-routing string to fix or re-route signals around the faulty TSV, and then burning that re-routing string into the fuse bank (and optionally testing to verify the re-routing string solves the problem) after which the configuration of that stacked semiconductor device is permanent and cannot be modified. Therefore, subsequent resets of the stacked semiconductor device, even a cold reboot, will then cause the device to download or read the re-routing string from the registers of the fuse bank and then shift that string through the stacked semiconductor device's various layers, causing the stacked semiconductor device to shift its signals according to the re-routing string.

Figure 4:
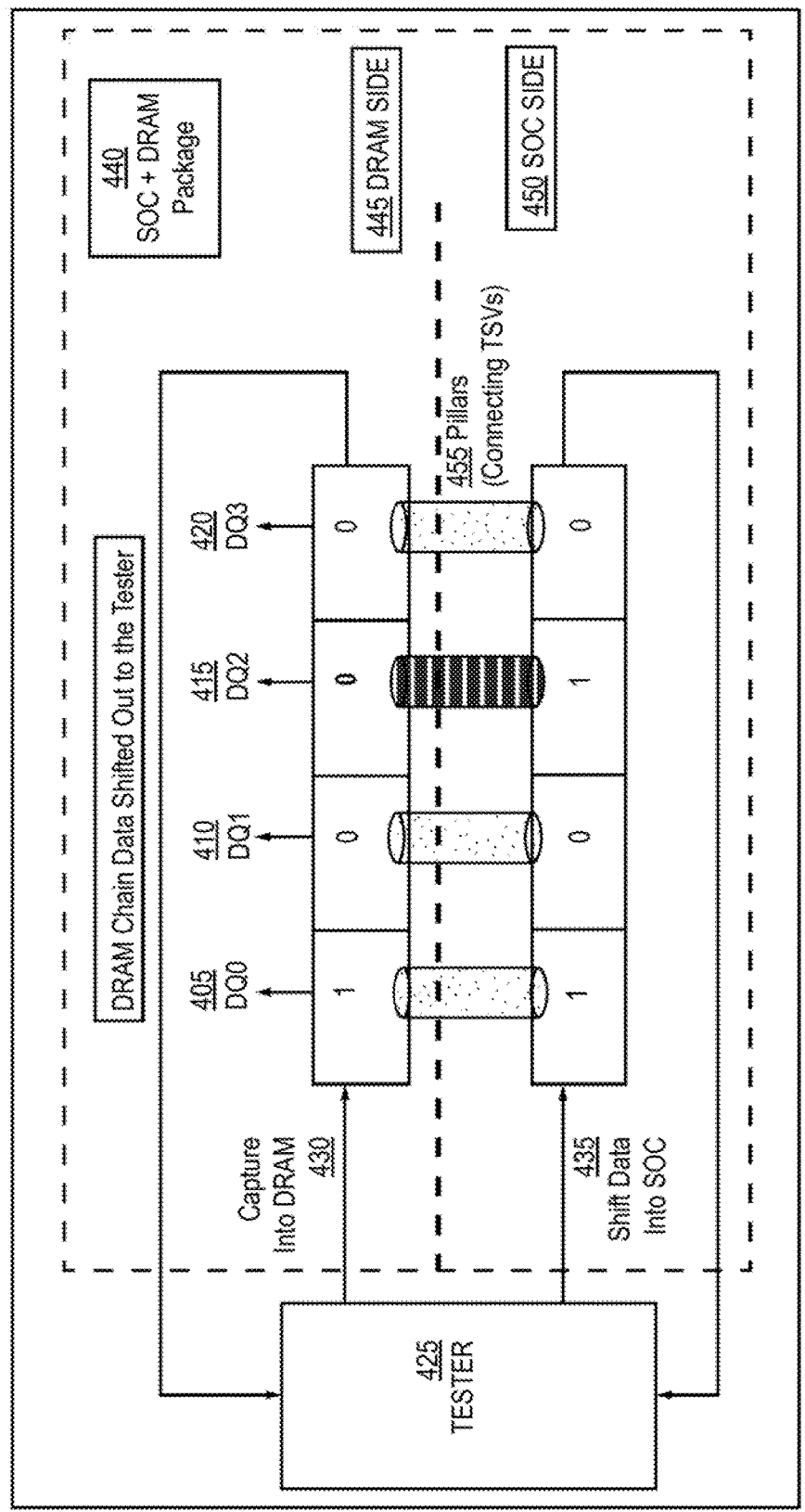
FIG. 4 depicts another exemplary stacked semiconductor device having a faulty or defective TSV in accordance with described embodiments.

FIG. 4 depicts another exemplary stacked semiconductor device 401 having a faulty or defective TSV 415 in accordance with described embodiments. Here, a faulty or defective TSV 415 is identified by an external tester which shifts vectors into the SOC and reads the capture data from the DRAM chains as depicted.

For instance, according to a particular embodiment, each of the captured bits taken from the DRAM chain data are compared with expected data which was input by the external tester 425 at the SOC side so as to identify which, if any, of the TSVs are associated with a fault and thus requires repair via the data shift and re-routing procedure.

As can be seen here, there is an external tester 425 which is not part of the stacked semiconductor device 401 formed from the SOC and DRAM package 440 which includes at least a DRAM side 445 and an SOC side 450.

The external tester 425 is depicted as inputting shift data into the SOC 435 which is then fed or transmitted through the connecting TSV pillars 455 interfacing the respective DRAM and SOC sides 445 and 450. The data is then picked up and captured into the DRAM at element 430 as shown through the respective TSV pillars (from left to right) DQ0 at element 405, DQ1 at element 410, DQ2 at element 415, and DQ3 at element 420. Ultimately the DRAM chain is data shifted out to the tester where the captured data from the DRAM side 445 may be compared with the shift data 435 input into the SOC side 450, to determine whether or not the current routing configuration is faulty or non-faulty. For instance, if the routing is the default (e.g., routing string 0000 for a four pillar configuration) such that all data paths traverse their originally intended TSV pillars, and the data compare at the tester 425 is acceptable, then it is not necessary to perform a re-routing procedure. However, if the default was previously identified as being faulty and a re-routing procedure thus instituted, then the above procedure can identify whether the re-routing is successful by inputting the shift data 435 at the SOC side 450 to traverse through the TSV pillars to the DRAM side 430 where the DRAM chain data is captured and shifted to the tester 425 for comparison as was done with the default configuration.

If the re-routing is also faulty after a data compare, then the correct routing has not yet been attained and a new routing scheme can be programmed and tested.

According to a particular embodiment, the external tester 425 communicates into the stacked semiconductor device 401 utilizing an inbuilt testing network (bus) of the stacked semiconductor device 401 over which the tester 425 sends/shifts 435 a series of data bits into the SOC chain at the SOC side 450. Next, a control signals from the tester to the DRAM stack captures previously sent data into the DRAM chain. The captured data is then shifted out of the DRAM chain and collected by the tester 425 where it is compared against input values where they are to be the same or against golden values where an expected modification of the values is expected and desirable. In such a way, it is possible to identify whether one of the TSV pillars utilized for the current iteration is faulty because if any of the TSV values are faulty then the external tester 425 will not end up with the correct data, but rather, will have unexpected data which will be revealed as a non-match when the collected values are compared against the input or expected values.

When a fault is identified by the tester 425, a detour (rerouting) pattern is computed to produce a string causing the data shifters of the stacked semiconductor device 401 to bypass a faulty TSV micro-pillar associated.

Figure 5:
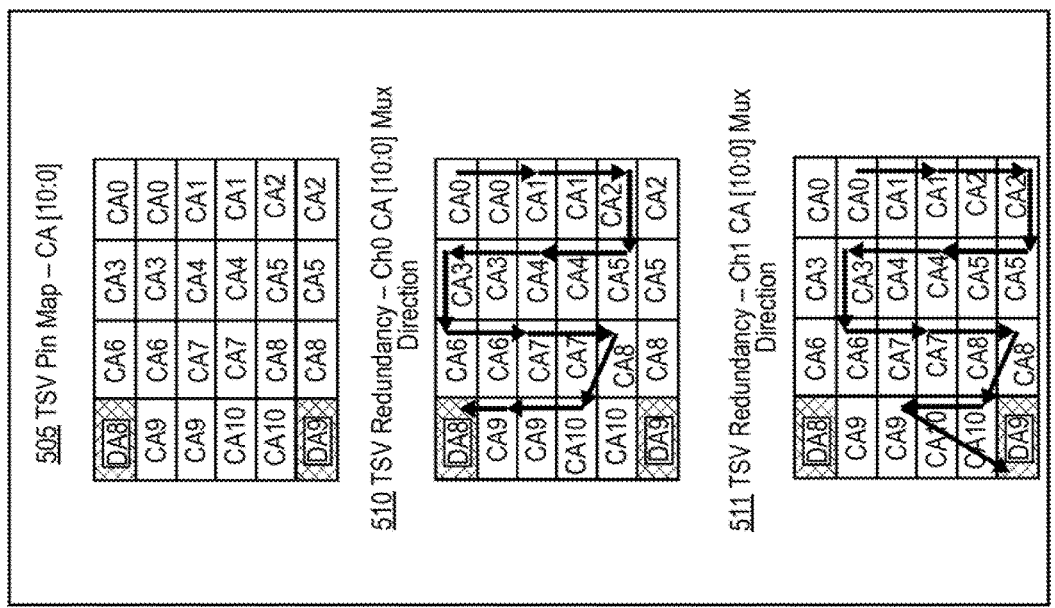
FIG. 5 depicts a TSV pillar re-routing map for two channels of the DDR/DRAM memory address lines, CA[10:0] in accordance with described embodiments.

FIG. 5 depicts a TSV pillar re-routing map 501 for two channels of the DDR/DRAM memory address lines, CA[10:0] in accordance with described embodiments.

In particular, at element 505 a TSV pin map—CA [10:0] is provided, where DA8 on a first channel and DA9 on a second channel provide redundant pillars 504 (e.g., redundant TSVs). TSV Pillars CA0 through CA10 on the first and second channels Ch0 and Ch1 represent normal (e.g., non-redundant or default) address pins 502 and 503 respectively for the first and second channels provided.

At elements 510 and 511 there is a TSV redundancy—Ch0 CA [10:0] Mux direction (element 510) and a TSV redundancy Ch1 CA [10:0] Mux direction (element 511) for the first and second channels. Such a mapping may be utilized for all the data bits as well.

As shown, two redundant TSV pillars are provided, one for each of the two channels, DA8 and DA9. At elements 510 and 511, it may be observed that a defect in Channel 0 necessitates detour or re-routing through the micro TSV pillar DA8 and a defect in channel 1 necessitates detour or re-routing through DA9. Additionally depicted here is the data shift direction in case of a faulty micro TSV pillar at each of the two channels.

FIG. 6 depicts a table 601 which may be used for shifting the address signals for any possible failed lane in accordance with described embodiments.

In particular, there is a Channel 0 CA[10:0] bus lane repair pin mux selection matrix providing the necessary detour encoding 699 beginning with 0h, the mux selects 600 from the shifted-string chain, along with the signal that appears on that lane, in the order of the signals beginning with CA9, and then the various pins, starting with redundant TSV pillar DA8 at column 615, CA9 at column 620, CA10 at column 625, CA8 at column 630, CA7 at column 635, CA6 at column 640, CA4 at column 645, CA5 at column 650, CA5 at column 655, CA2 at column 660, CA2 at column 660, CA1 at column 665, and CA0 at column 670. Such a table may be utilized to compute the re-routing string for the data shifters (e.g., 225 and 205 at FIG. 2) for storage in the device registers (e.g., 210 and 230 at FIG. 2). From the top mux select 600 beginning with 0h, there is shown each of the mux selects for each lane, from 0h mux select 616, 1h mux select 602, 2h mux select 614, 3h mux select 603, 4h mux select 604, 4 h mux select 604, 5h mux select 605, 6h mux select 606, 7h mux select 607, 8h mux select 608, 9 h mux select 609, Ah mux select 610, Bh mux select 611, and Ch to Fh mux select 612.

The more heavily hashed textured boxes indicate the pins which have been muxed and shifted to the left toward the DA8 pin at column 615. The remaining lighter hashed textured boxes depict those pins which remain un-shifted, that is, they are pins which are not re-routed or detoured.

Figure 7:
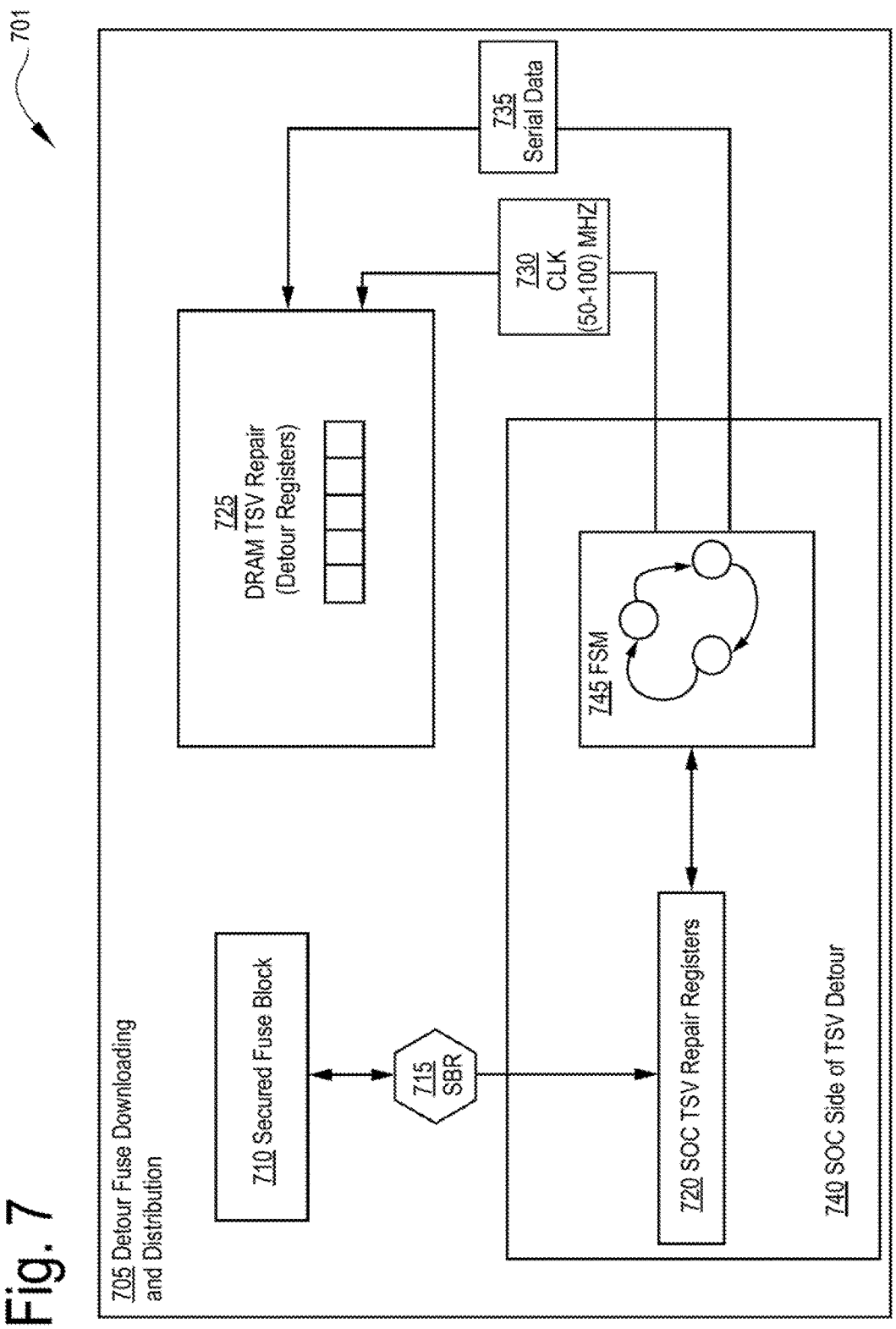
FIG. 7 depicts an exemplary process flow implementing a detour fuse downloading and distribution scheme in accordance with described embodiments.

FIG. 7 depicts an exemplary process flow 701 implementing a detour fuse downloading and distribution 705 scheme in accordance with described embodiments.

In particular, it may be observed within the provided detour fuse downloading and distribution 705 scheme that there is an SOC side of the TSV detour at block 740 and also a DRAM TSV repair 725 block having therein the detour registers. According to a particular embodiment, processing includes uploading the detour strings into the secured Fuse RAM 710 as depicted by the SBR transmission 715 from the SOC side TSV repair registers 720. Once the detour string is securely stored into a fuse bank or the Secure fuse Bank Registers (SBR) then on any cold boot, the previously stored string is downloaded through the side band network from the fuse RAM into the registers and into the SOC side logic. On a warm boot or warm (non-power loss or low-power mode transition) reset where the DRAM loses the value another transfer is triggered on the SOC side 740 to again download the re-routing string into the DRAM. The depicted FSM (Finite State machine) 745 takes the downloaded re-routing string and transmits it as clock 730 and serial data 735 onto a two wire bus into the DRAM to carry out the DRAM TSV repair 725 (e.g., to enable the re-routing at operation or run-time).

In accordance with one embodiment, propagating the re-routing string comprises propagating a binary string of 0's and 1's to the muxes present at each TSV pillar causing the muxes to route signals down one of two paths in accordance with the re-routing string's bit (e.g., 1 or 0) at the position corresponding to that mux.

According to one embodiment, the re-routing string is propagated from the SOC die to one or more memory dies present within the stacked semiconductor device via a secure onboard side band channel. For instance, consider that 50 bits are required to represent the full re-routing string for a particular stacked semiconductor device. Rather than having 50 wires to transmit the entire string in parallel which would be very fast but extremely costly, two connecting wires are utilized for the secure onboard sideband channel through which the SOC die will transmit the entirety of the re-routing string via a serial data 735 transmission, one bit at a time, over 50 clock cycles for the exemplary 50-bit string.

Figure 8:
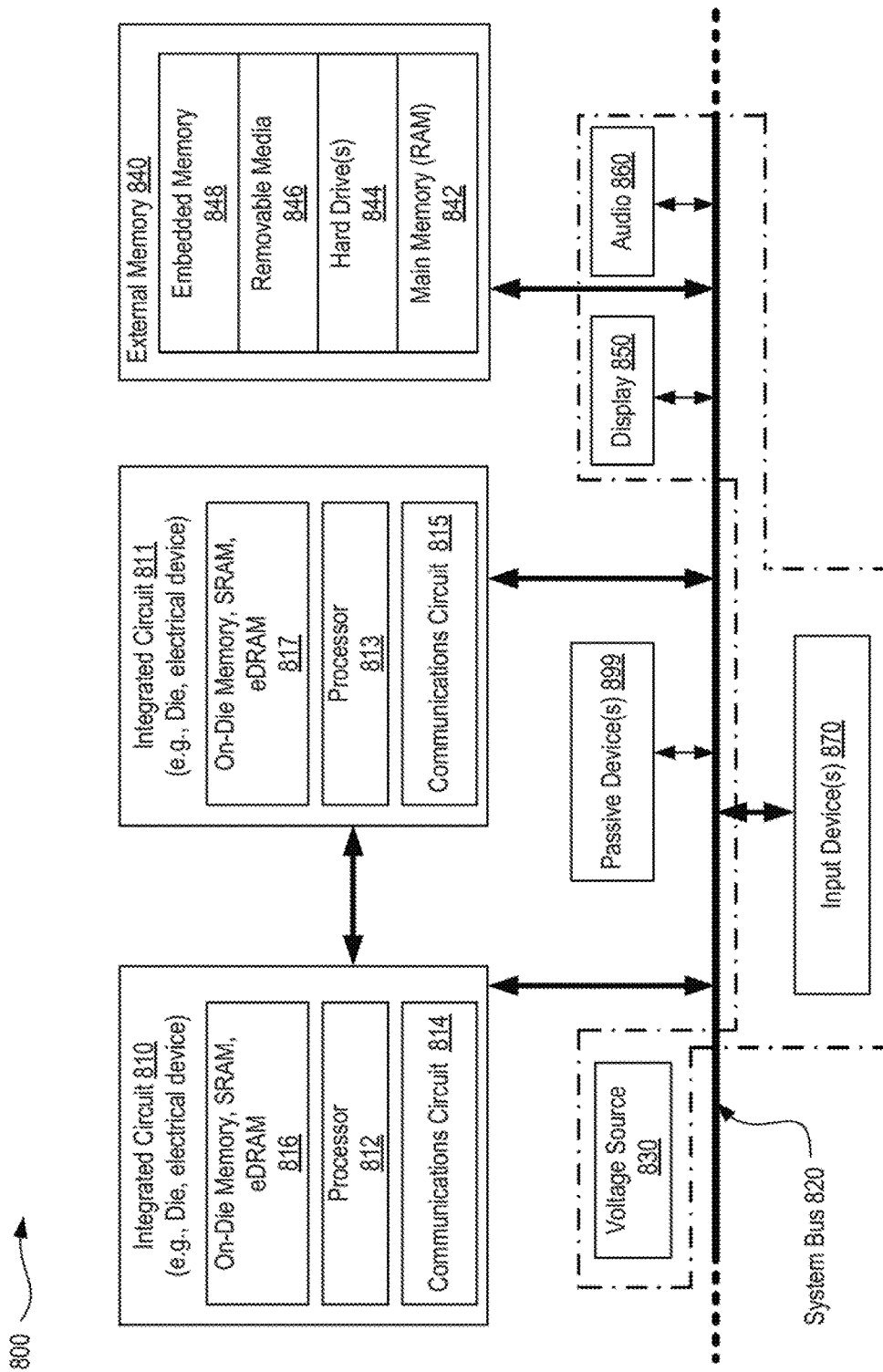
FIG. 8 is a schematic of a computer system in accordance with described embodiments.

FIG. 8 is a schematic of a computer system 800 in accordance with described embodiments. The computer system 800 (also referred to as the electronic system 800) as depicted can embody means for implementing die recovery in Two-Level Memory (2LM) stacked die subsystems, according to any of the several disclosed embodiments and their equivalents as set forth in this disclosure. The computer system 800 may be a mobile device such as a net-book computer. The computer system 800 may be a mobile device such as a wireless smart phone or tablet. The computer system 800 may be a desktop computer. The computer system 800 may be a hand-held reader. The computer system 800 may be a server system. The computer system 800 may be a supercomputer or high-performance computing system.

In accordance with one embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

Such an integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, electrical devices having gradient encapsulant protection, as disclosed herein.

In accordance with one embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In accordance with one embodiment, the integrated circuit 810 is complemented with a subsequent integrated circuit 811. Useful embodiments include a dual processor 813 and a dual communications circuit 815 and dual on-die memory 817 such as SRAM. In accordance with one embodiment, the dual integrated circuit 810 includes embedded on-die memory 817 such as eDRAM.

In one embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In accordance with one embodiment, the electronic system 800 also includes a display device 850 and an audio output 860. In one embodiment, the electronic system 800 includes an input device 870 such as a controller that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including means for implementing die recovery in Two-Level Memory (2LM) stacked die subsystems into a semiconductor substrate package, according to any of the several disclosed embodiments and their equivalents, an electronic system, a computer system, one or more methods of fabricating an integrated circuit, and one or more methods of fabricating an electronic assembly that includes a package substrate or a semiconductor package having therein means for implementing die recovery in Two-Level Memory (2LM) stacked die subsystems, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates and semiconductor packages having means for implementing die recovery in Two-Level Memory (2LM) stacked die subsystems and semiconductor substrate package embodiments and their equivalents. A foundation substrate 898 may be included, as represented by the dashed line of FIG. 8. Passive devices 899 may also be included, as is also depicted in FIG. 8.

Figure 9:
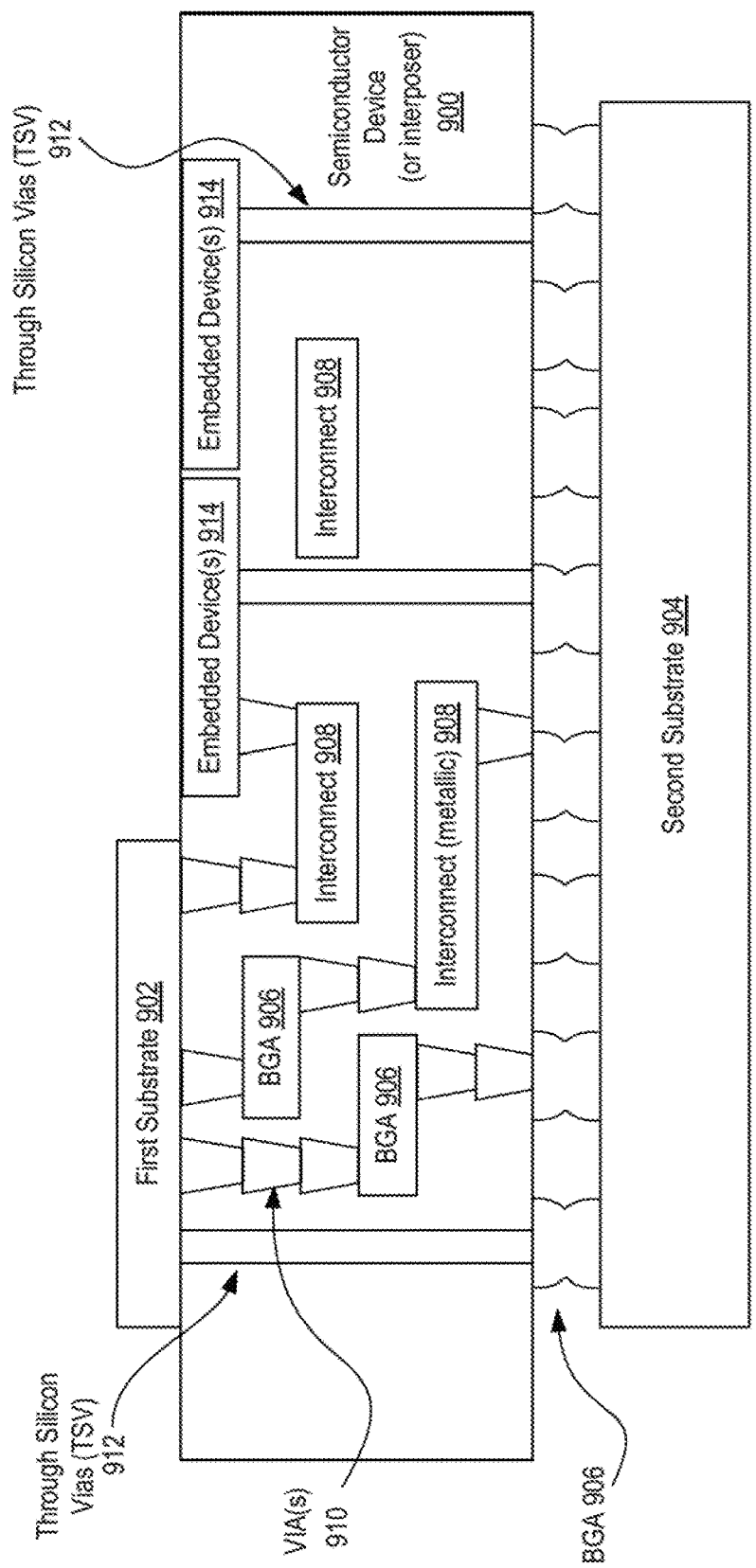
FIG. 9 illustrates an interposer that includes one or more described embodiments.

FIG. 9 illustrates an interposer 900 that includes one or more described embodiments. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with described embodiments, apparatuses or processes disclosed herein may be used in the fabrication of interposer 900.

Figure 10:
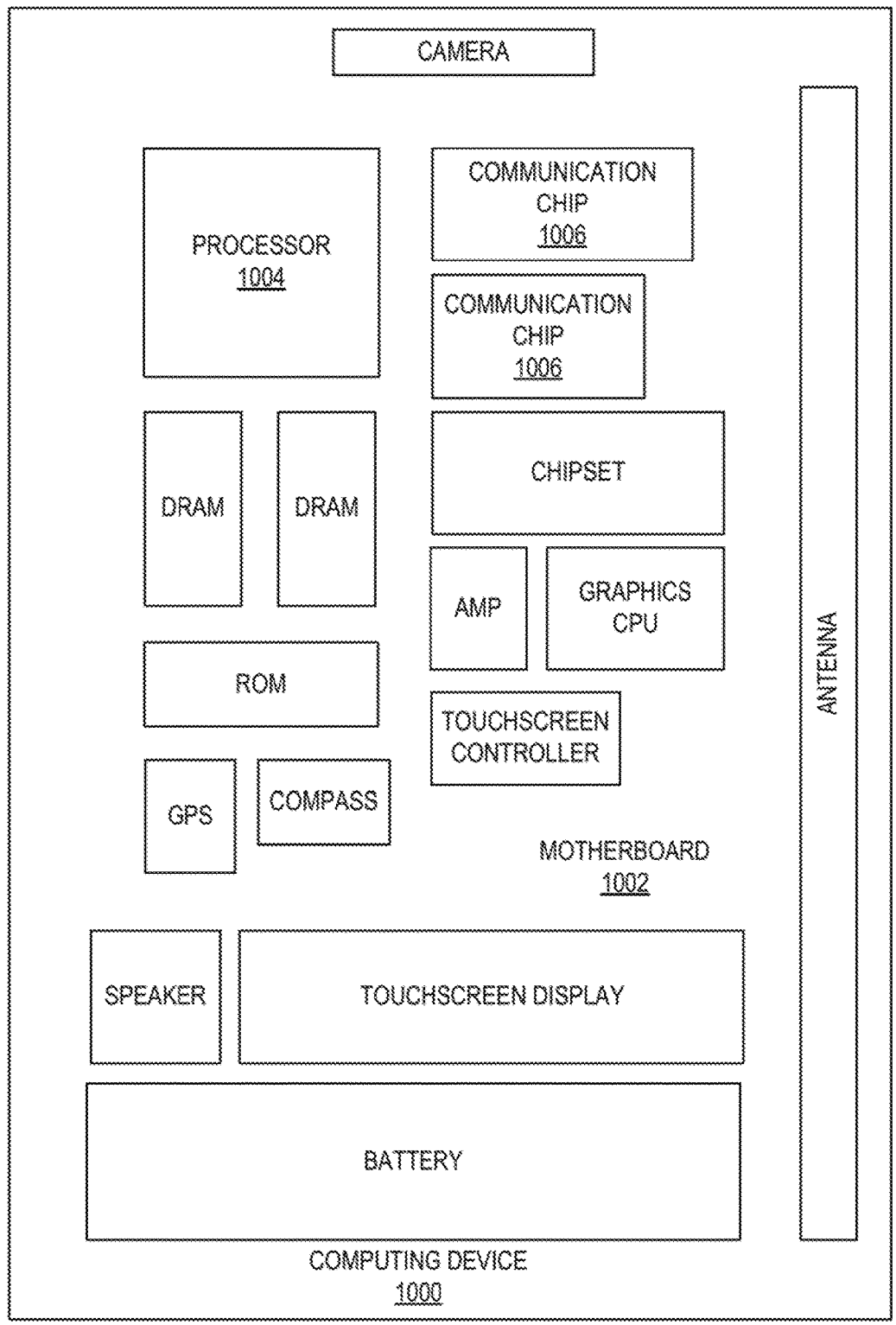
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as MOS-FET transistors built in accordance with implementations of the invention.

In further implementations, another component housed within the computing device 1000 may contain an integrated circuit die that includes one or more devices, such as MOS-FET transistors built in accordance with implementations of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
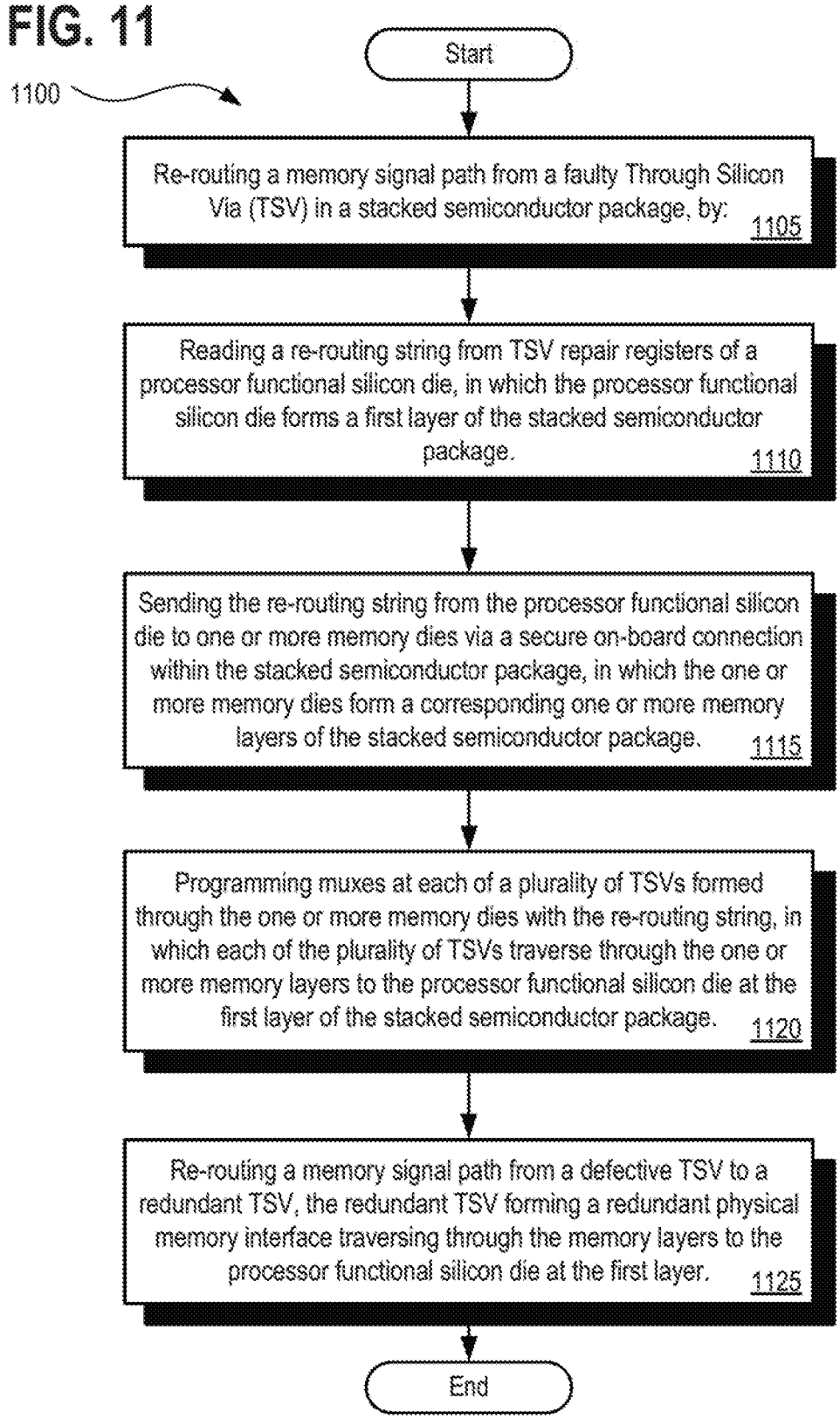
FIG. 11 is a flow diagram illustrating a method for implementing die recovery in Two-Level Memory (2LM) stacked die subsystems in accordance with described embodiments.

FIG. 11 is a flow diagram illustrating a method 1100 for implementing die recovery in Two-Level Memory (2LM) stacked die subsystems in accordance with described embodiments. Some of the blocks and/or operations listed below are optional in accordance with certain embodiments. The numbering of the blocks presented is for the sake of clarity and is not intended to prescribe an order of operations in which the various blocks must occur. Additionally, operations from flow 1100 may be utilized in a variety of combinations.

At block 1105 the method 1100 for re-routing a memory signal path from a faulty Through Silicon Via (TSV) in a stacked semiconductor package begins with:

At block 1110 the method includes reading a re-routing string from TSV repair registers of a processor functional silicon die, in which the processor functional silicon die forms a first layer of the stacked semiconductor package.

At block 1115 the method includes sending the re-routing string from the processor functional silicon die to one or more memory dies via a secure on-board connection within the stacked semiconductor package, in which the one or more memory dies form a corresponding one or more memory layers of the stacked semiconductor package.

At block 1120 the method includes programming muxes at each of a plurality of TSVs formed through the one or more memory dies with the re-routing string, in which each of the plurality of TSVs traverse through the one or more memory layers to the processor functional silicon die at the first layer of the stacked semiconductor package.

At block 1125 the method includes re-routing a memory signal path from a defective TSV to a redundant TSV, the redundant TSV forming a redundant physical memory interface traversing through the memory layers to the processor functional silicon die at the first layer.

While the subject matter disclosed herein has been described by way of example and in terms of the specific embodiments, it is to be understood that the claimed embodiments are not limited to the explicitly enumerated embodiments disclosed. To the contrary, the disclosure is intended to cover various modifications and similar arrangements as would be apparent to those skilled in the art. Therefore, the scope of the appended claims should be accorded the broadest interpretation so as to encompass all such modifications and similar arrangements. It is to be understood that the above description is intended to be illustrative, and not restrictive. Many other embodiments will be apparent to those of skill in the art upon reading and understanding the above description. The scope of the disclosed subject matter is therefore to be determined in reference to the appended claims, along with the full scope of equivalents to which such claims are entitled.

It is therefore in accordance with the described embodiments, that:

According to one embodiment there is a stacked semiconductor package, including: a processor functional silicon die at a first layer of the stacked semiconductor package; one or more memory dies forming a corresponding one or more memory layers of the stacked semiconductor package; a plurality of Through Silicon Vias (TSVs) formed through the one or more memory dies, in which each of the plurality of TSVs traverse through the one or more memory layers to the processor functional silicon die at the first layer of the stacked semiconductor package; a plurality of physical memory interfaces electrically interfacing the one or more memory dies to the processor functional silicon die at the first layer through the memory layers via the plurality of TSVs; a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

According to another embodiment the stacked semiconductor package, each TSV forms a physical memory path providing a continuous electrical interface from one of the memory dies through the one or more memory layers to the processor functional silicon die; and in which each memory signal path forms a logical memory path traversing one of the physical memory paths through the TSVs; in which one or more of the memory signal paths may be re-routed along the redundant physical memory interface using the redundant TSV; and in which a defective physical memory path associated with a defective TSV may be bypassed by re-routing the memory signal path to functional physical signal path associated with a functional TSV or the redundant physical memory interface associated with the redundant TSV.

According to another embodiment the stacked semiconductor package, a re-routing string computed and permanently written to the stacked semiconductor package at a time of manufacture is used to reroute the memory signal path from the defective physical memory interface at the defective TSV to the functional signal path traversing the redundant TSV.

According to another embodiment the stacked semiconductor package, the memory signal path re-routed from the defective physical memory interface to the functional signal path carries memory address and data traffic from the memory dies between one of the memory dies and the processor functional silicon die.

According to another embodiment, the stacked semiconductor package further includes: a package substrate layer forming a bottom layer of the stacked semiconductor package; and in which the processor functional silicon die at the first layer of the stacked semiconductor package is affixed to the package substrate layer.

According to another embodiment the stacked semiconductor package, a first memory die forms a first memory layer positioned atop the processor functional silicon die layer; and in which a second memory die forms a second memory layer positioned atop the first memory layer.

According to another embodiment the stacked semiconductor package, the second memory die is electrically interfaced to the processor functional silicon die through the plurality of TSVs which traverse through the second first memory die at the first memory layer.

According to another embodiment the stacked semiconductor package, the stacked semiconductor package embodies a Two-Level-Memory (2LM) stacked die sub-system having one or more memory silicon dies forming the one or more memory layers and one or more functional silicon dies formed from a System On a Chip (SOC) functional silicon die having the processor functional silicon die embedded therein or a logic functional silicon die forming the processor functional silicon die or a CPU die embodying the processor functional silicon die at the first layer of the stacked semiconductor package.

According to another embodiment the stacked semiconductor package, the first layer is formed from a System On a Chip (SOC) functional silicon die manufactured by the manufacturer of the stacked semiconductor package; and in which a second layer is formed from a DRAM memory silicon die manufactured by a third party and acquired by the manufacturer of the stacked semiconductor package and integrated into the stacked semiconductor package by the manufacturer of the stacked semiconductor package.

According to another embodiment the stacked semiconductor package, at least one of the memory dies are formed from a phase change memory die.

According to another embodiment the stacked semiconductor package, the processor functional silicon die includes a System On a Chip (SOC) functional silicon die having a secured fuse block embedded therein; and in which a re-routing string used to reroute the memory signal path from the defective physical memory interface to the functional signal path is permanently written into the secured fuse block of the SOC functional silicon die at the time of manufacture of the stacked semiconductor package.

According to another embodiment the stacked semiconductor package, the re-routing string is downloaded from the secured fuse block into registers of the SOC functional silicon die at every cold boot of the stacked semiconductor package.

According to another embodiment, there is a method for re-routing a memory signal path from a faulty Through Silicon Via (TSV) in a stacked semiconductor package, by: reading a re-routing string from TSV repair registers of a processor functional silicon die, in which the processor functional silicon die forms a first layer of the stacked semiconductor package; sending the re-routing string from the processor functional silicon die to one or more memory dies via a secure on-board connection within the stacked semiconductor package, in which the one or more memory dies form a corresponding one or more memory layers of the stacked semiconductor package; programming muxes at each of a plurality of TSVs formed through the one or more memory dies with the re-routing string, in which each of the plurality of TSVs traverse through the one or more memory layers to the processor functional silicon die at the first layer of the stacked semiconductor package; and re-routing a memory signal path from a defective TSV to a redundant TSV, the redundant TSV forming a redundant physical memory interface traversing through the memory layers to the processor functional silicon die at the first layer.

According to another embodiment of the method, the re-routing string from the processor functional silicon die to the one or more memory dies via the secure on-board connection within the stacked semiconductor package includes sending the re-routing string over a two wire serial interface.

According to another embodiment of the method, the two wire interface includes a clock and a serial data interface from the processor functional silicon die to the one or more memory dies.

According to another embodiment of the method, the two wire interface transmits the re-routing string via a serial data one bit at a time, with one bit transmitted per clock cycle.

According to another embodiment, the method further includes: storing the re-routing string within a detour registers at each of the one or more memory dies; and in which programming the muxes at each of a plurality of TSVs with the re-routing string includes programming the muxes at each of the plurality of TSVs at each of the one or more memory dies from the detour registers at each of the one or more memory dies having the re-routing string stored therein.

According to another embodiment of the method, the secure on-board connection includes a side band interface the stacked semiconductor package which is inaccessible external to the stacked semiconductor package such that any data flow transferred through the secure onboard connection cannot be derived from outside of the stacked semiconductor package.

According to another embodiment of the method, the TSVs form TSV micro pillars oriented vertically through the entire stack of the one or more memory dies, electrically interfacing the processor functional silicon die with the one or more memory dies of the stacked semiconductor package.

According to another embodiment of the method, the processor functional silicon die includes a System On a Chip (SOC) functional silicon die having a secured fuse block embedded therein; and in which the re-routing string used for re-routing the memory signal path from the defective TSV to the redundant TSV is permanently written into the secured fuse block of the SOC functional silicon die at the time of manufacture of the stacked semiconductor package.

According to another embodiment, the method further includes: downloading the re-routing string from the secured fuse block into registers of the SOC functional silicon die at every cold boot of the stacked semiconductor package; and shifting the re-routing string from the registers of the SOC functional silicon die to detour registers at the one or more memory dies via a secure on-board connection of the stacked semiconductor package as part of the cold boot process for the stacked semiconductor package.

According to another embodiment of the method, the stacked semiconductor package embodies a Two-Level-Memory (2LM) stacked die sub-system having one or more memory silicon dies forming the one or more memory layers and one or more functional silicon dies formed from a System On a Chip (SOC) functional silicon die having the processor functional silicon die embedded therein or a logic functional silicon die forming the processor functional silicon die or a CPU die embodying the processor functional silicon die at the first layer of the stacked semiconductor package.

According to yet another embodiment there is an electronics module including: a printed circuit board; a stacked semiconductor package electrically interfaced to the printed circuit board; and in which the stacked semiconductor package includes: (i) a substrate layer; (ii) a processor functional silicon die at a first layer of the stacked semiconductor package atop the substrate layer; (iii) one or more memory dies forming a corresponding one or more memory layers of the stacked semiconductor package; (iv) a plurality of Through Silicon Vias (TSVs) formed through the one or more memory dies, in which each of the plurality of TSVs traverse through the one or more memory layers to the processor functional silicon die at the first layer of the stacked semiconductor package; (v) a plurality of physical memory interfaces electrically interfacing the one or more memory dies to the processor functional silicon die at the first layer through the memory layers via the plurality of TSVs; (vi) a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

According to another embodiment of the electronics module, the electronics module includes one of: a drone and robot control electronics module; a smartphone electronics module; a tablet electronics module; a gesture control electronics module for a computer; a 3D photography electronics module; a 3D immersive gaming electronics module; a face recognition electronics module to perform face recognition base security in lieu of alphanumerical passwords; an image capture device electronics module having one or more optical and Complementary metal-oxide-semiconductor (CMOS) components affixed to the printed circuit board as the top side or bottom side components; a depth sensing camera electronics module to perform any of stereoscopic imaging depth sensing, coded light depth sensing, or laser time of flight depth sensing.

According to another embodiment of the electronics module, the electronics module includes is embedded within a wearable technology to be worn as one of: a clothing item; sports attire; a shoe; fashion electronics to be worn as a clothing item or an accessory; tech togs to be worn as a clothing item or an accessory; or fashionable technology to be worn as a clothing item or an accessory.

What is claimed is:

1. A stacked semiconductor package, comprising:
   a processor functional silicon die at a first layer of the stacked semiconductor package, wherein the processor functional silicon die comprises a TSV repair register comprising a re-routing string;
   one or more memory dies forming a corresponding one or more memory layers of the stacked semiconductor package;
   a plurality of Through Silicon Vias (TSVs) formed through the one or more memory dies, wherein each of the plurality of TSVs traverse through the one or more memory layers to the processor functional silicon die at the first layer of the stacked semiconductor package; a plurality of physical memory interfaces electrically interfacing the one or more memory dies to the processor functional silicon die at the first layer through the memory layers via the plurality of TSVs; and
   a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

2. The stacked semiconductor package of claim 1:
   wherein each TSV forms a physical memory path providing a continuous electrical interface from one of the memory dies through the one or more memory layers to the processor functional silicon die; and
   wherein each memory signal path forms a logical memory path traversing one of the physical memory paths through the TSVs;
   wherein one or more of the memory signal paths may be re-routed along the redundant physical memory interface using the redundant TSV; and
   wherein a defective physical memory path associated with a defective TSV may be bypassed by re-routing the memory signal path to functional physical signal path associated with a functional TSV or the redundant physical memory interface associated with the redundant TSV.

3. The stacked semiconductor package of claim 1:
   wherein a re-routing string computed and permanently written to the stacked semiconductor package at a time of manufacture is used to reroute the memory signal path from the defective physical memory interface at the defective TSV to the functional signal path traversing the redundant TSV.

4. The stacked semiconductor package of claim 1:
   wherein the memory signal path re-routed from the defective physical memory interface to the functional signal path carries memory address and data traffic from the memory dies between one of the memory dies and the processor functional silicon die.

5. The stacked semiconductor package of claim 1, further comprising: a package substrate layer forming a bottom layer of the stacked semiconductor package; and wherein the processor functional silicon die at the first layer of the stacked semiconductor package is affixed to the package substrate layer.

6. The stacked semiconductor package of claim 5:
   wherein a first memory die forms a first memory layer positioned atop the processor functional silicon die layer; and
   wherein a second memory die forms a second memory layer positioned atop the first memory layer.

7. The stacked semiconductor package of claim 6:
   wherein the second memory die is electrically interfaced to the processor functional silicon die through the plurality of TSVs which traverse through the second first memory die at the first memory layer.

8. The stacked semiconductor package of claim 1, wherein the stacked semiconductor package embodies a Two-Level-Memory (2LM) stacked die sub-system having one or more memory silicon dies forming the one or more memory layers and one or more functional silicon dies formed from a System On a Chip (SOC) functional silicon die having the processor functional silicon die embedded therein or a logic functional silicon die forming the processor functional silicon die or a CPU die embodying the processor functional silicon die at the first layer of the stacked semiconductor package.

9. The stacked semiconductor package of claim 1:
   wherein the first layer is formed from a System On a Chip (SOC) functional silicon die manufactured by the manufacturer of the stacked semiconductor package; and wherein a second layer is formed from a DRAM memory silicon die manufactured by a third party and acquired by the manufacturer of the stacked semiconductor package and integrated into the stacked semiconductor package by the manufacturer of the stacked semiconductor package.

10. The stacked semiconductor package of claim 1, wherein at least one of the memory dies are formed from a phase change memory die.

11. The stacked semiconductor package of claim 1:
    wherein the processor functional silicon die comprises a System On a Chip (SOC) functional silicon die having a secured fuse block embedded therein; and
    wherein a re-routing string used to reroute the memory signal path from the defective physical memory interface to the functional signal path is permanently written into the secured fuse block of the SOC functional silicon die at the time of manufacture of the stacked semiconductor package.

12. The stacked semiconductor package of claim 11:
    wherein the re-routing string is downloaded from the secured fuse block into registers of the SOC functional silicon die at every cold boot of the stacked semiconductor package.

13. A method for re-routing a memory signal path from a faulty Through Silicon Via (TSV) in a stacked semiconductor package, wherein the method comprises:

reading a re-routing string from TSV repair registers of a processor functional silicon die, wherein the processor functional silicon die forms a first layer of the stacked semiconductor package;

sending the re-routing string from the processor functional silicon die to one or more memory dies via a secure on-board connection within the stacked semiconductor package, wherein the one or more memory dies form a corresponding one or more memory layers of the stacked semiconductor package;

programming muxes at each of a plurality of TSVs formed through the one or more memory dies with the re-routing string, wherein each of the plurality of TSVs traverse through the one or more memory layers to the processor functional silicon die at the first layer of the stacked semiconductor package; and re-routing a memory signal path from a defective TSV to a redundant TSV, the redundant TSV forming a redundant physical memory interface traversing through the memory layers to the processor functional silicon die at the first layer.

14. The method of claim 13, wherein sending the re-routing string from the processor functional silicon die to the one or more memory dies via the secure on-board connection within the stacked semiconductor package comprises sending the re-routing string over a two wire serial interface.

15. The method of claim 14, wherein the two wire interface comprises a clock and a serial data interface from the processor functional silicon die to the one or more memory dies.

16. The method of claim 14, wherein the two wire interface transmits the re-routing string via a serial data one bit at a time, with one bit transmitted per clock cycle.

17. The method of claim 13, further comprising:
storing the re-routing string within a detour registers at each of the one or more memory dies; and
wherein programming the muxes at each of a plurality of TSVs with the re-routing string comprises programming the muxes at each of the plurality of TSVs at each of the one or more memory dies from the detour registers at each of the one or more memory dies having the re-routing string stored therein.

18. The method of claim 13, wherein the secure on-board connection comprises a side band interface the stacked semiconductor package which is inaccessible external to the stacked semiconductor package such that any data flow transferred through the secure onboard connection cannot be derived from outside of the stacked semiconductor package.

19. The method of claim 13, wherein the TSVs form TSV micro pillars oriented vertically through the entire stack of the one or more memory dies, electrically interfacing the processor functional silicon die with the one or more memory dies of the stacked semiconductor package.

20. The method of claim 13:
wherein the processor functional silicon die comprises a System On a Chip (SOC) functional silicon die having a secured fuse block embedded therein; and
wherein the re-routing string used for re-routing the memory signal path from the defective TSV to the redundant TSV is permanently written into the secured fuse block of the SOC functional silicon die at the time of manufacture of the stacked semiconductor package.

21. The method of claim 20, further comprising:
downloading the re-routing string from the secured fuse block into registers of the SOC functional silicon die at every cold boot of the stacked semiconductor package; and shifting the re-routing string from the registers of the SOC functional silicon die to detour registers at the one or more memory dies via a secure on-board connection of the stacked semiconductor package as part of the cold boot process for the stacked semiconductor package.

22. The method of claim 13, wherein the stacked semiconductor package embodies a Two-Level-Memory (2LM) stacked die sub-system having one or more memory silicon dies forming the one or more memory layers and one or more functional silicon dies formed from a System On a Chip (SOC) functional silicon die having the processor functional silicon die embedded therein or a logic functional silicon die forming the processor functional silicon die or a CPU die embodying the processor functional silicon die at the first layer of the stacked semiconductor package.

23. An electronics module comprising: a printed circuit board;
a stacked semiconductor package electrically interfaced to the printed circuit board; and
wherein the stacked semiconductor package comprises:
(i) a substrate layer;
(ii) a processor functional silicon die at a first layer of the stacked semiconductor package atop the substrate layer, wherein the processor functional silicon die comprises a TSV repair register comprising a re-routing string;
(iii) one or more memory dies forming a corresponding one or more memory layers of the stacked semiconductor package;
(iv) a plurality of Through Silicon Vias (TSVs) formed through the one or more memory dies, wherein each of the plurality of TSVs traverse through the one or more memory layers to the processor functional silicon die at the first layer of the stacked semiconductor package;
(v) a plurality of physical memory interfaces electrically interfacing the one or more memory dies to the processor functional silicon die at the first layer through the memory layers via the plurality of TSVs; and
(vi) a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV.

24. The electronics module of claim 23, wherein the electronics module comprises one of:
a drone and robot control electronics module;
a smartphone electronics module;
a tablet electronics module;
a gesture control electronics module for a computer;
a 3D photography electronics module;
a 3D immersive gaming electronics module;
a face recognition electronics module to perform face recognition base security in-lieu of alphanumerical passwords;
an image capture device electronics module having one or more optical and Complementary metal-oxide-semiconductor (CMOS) components affixed to the printed circuit board as the top side or bottom side components;
a depth sensing camera electronics module to perform any of stereoscopic imaging depth sensing, coded light depth sensing, or laser time of flight depth sensing.

25. The electronics module of claim 23, wherein the electronics module comprises is embedded within a wearable technology to be worn as one of:

a clothing item;
sports attire;
a shoe;
fashion electronics to be worn as a clothing item or an accessory;
tech togs to be worn as a clothing item or an accessory; or
fashionable technology to be worn as a clothing item or an accessory.

26. A stacked semiconductor package, comprising:
a processor functional silicon die at a first layer of the stacked semiconductor package;
one or more memory dies forming a corresponding one or more memory layers of the stacked semiconductor package;
a plurality of Through Silicon Vias (TSVs) formed through the one or more memory dies, wherein each of the plurality of TSVs traverse through the one or more memory layers to the processor functional silicon die at the first layer of the stacked semiconductor package; a plurality of physical memory interfaces electrically interfacing the one or more memory dies to the processor functional silicon die at the first layer through the memory layers via the plurality of TSVs;
a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV, wherein the first layer is formed from a System On a Chip (SOC) functional silicon die manufactured by the manufacturer of the stacked semiconductor package; and wherein a second layer is formed from a DRAM memory silicon die manufactured by a third party and acquired by the manufacturer of the stacked semiconductor package and integrated into the stacked semiconductor package by the manufacturer of the stacked semiconductor package.

27. A stacked semiconductor package, comprising:
a processor functional silicon die at a first layer of the stacked semiconductor package, wherein the processor functional silicon die comprises a System On a Chip (SOC) functional silicon die having a secured fuse block embedded therein;
one or more memory dies forming a corresponding one or more memory layers of the stacked semiconductor package;
a plurality of Through Silicon Vias (TSVs) formed through the one or more memory dies, wherein each of the plurality of TSVs traverse through the one or more memory layers to the processor functional silicon die at the first layer of the stacked semiconductor package; a plurality of physical memory interfaces electrically interfacing the one or more memory dies to the processor functional silicon die at the first layer through the memory layers via the plurality of TSVs;
a redundant physical memory interface formed by a redundant TSV traversing through the memory layers to the processor functional silicon die at the first layer through which to reroute a memory signal path from a defective physical memory interface at a defective TSV to a functional signal path traversing the redundant TSV, wherein a re-routing string used to reroute the memory signal path from the defective physical memory interface to the functional signal path is permanently written into the secured fuse block of the SOC functional silicon die at the time of manufacture of the stacked semiconductor package.

28. The stacked semiconductor package of claim 27:
wherein the re-routing string is downloaded from the secured fuse block into registers of the SOC functional silicon die at every cold boot of the stacked semiconductor package.

* * * * *